유에스008274098B2

United States Patent
Chung et al.

(10) Patent No.: US 8,274,098 B2
(45) Date of Patent: Sep. 25, 2012

(54) FIELD EFFECT TRANSISTOR, LOGIC CIRCUIT INCLUDING THE SAME AND METHODS OF MANUFACTURING THE SAME

(75) Inventors: Hyun-jong Chung, Daejeon (KR); Ran-ju Jung, Suwon-si (KR); Sun-ae Seo, Hwaseong-si (KR); Dong-chul Kim, Suwon-si (KR); Chang-won Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1071 days.

(21) Appl. No.: 12/005,372

(22) Filed: Dec. 27, 2007

(65) Prior Publication Data

US 2008/0312088 A1   Dec. 18, 2008

(30) Foreign Application Priority Data

Jun. 13, 2007   (KR) ........................ 10-2007-0058009

(51) Int. Cl.
*H01L 29/66* (2006.01)
(52) U.S. Cl. ...................... 257/192; 257/E21.7; 257/194; 257/196; 257/29; 257/E21.411; 505/193; 505/330
(58) Field of Classification Search .................. 505/193, 505/330; 257/29, E21.411
See application file for complete search history.

(56) References Cited

U.S. PATENT DOCUMENTS

| | | | |
|---|---|---|---|
| 7,091,096 B2 * | 8/2006 | Balasubramanian et al. | 438/292 |
| 7,782,650 B2 * | 8/2010 | Bertin et al. ................... | 365/148 |
| 2004/0061422 A1 * | 4/2004 | Avouris et al. ................ | 313/315 |
| 2004/0197975 A1 | 10/2004 | Krivokapic et al. | |
| 2006/0205602 A1 * | 9/2006 | Endo ............................. | 505/193 |
| 2007/0059947 A1 * | 3/2007 | Moriya et al. ................ | 438/780 |
| 2007/0187694 A1 * | 8/2007 | Pfeiffer .......................... | 257/76 |

FOREIGN PATENT DOCUMENTS

| | | |
|---|---|---|
| JP | 02-015675 A | 1/1990 |
| JP | 05-136167 A | 6/1993 |
| KR | 1020010005298 A | 1/2001 |

* cited by examiner

*Primary Examiner* — Mamadou Diallo
(74) *Attorney, Agent, or Firm* — Harness, Dickey & Pierce, P.L.C.

(57) ABSTRACT

Provided are a field effect transistor, a logic circuit including the same and methods of manufacturing the same. The field effect transistor may include an ambipolar layer that includes a source region, a drain region, and a channel region between the source region and the drain region, wherein the source region, the drain region, and the channel region may be formed in a monolithic structure, a gate electrode on the channel region, and an insulating layer separating the gate electrode from the ambipolar layer, wherein the source region and the drain region have a width greater than that of the channel region in a second direction that crosses a first direction in which the source region and the drain region are connected to each other.

19 Claims, 8 Drawing Sheets

V(source) < 0

V(gate) > 0

V(gate) < 0

FIELD EFFECT TRANSISTOR, LOGIC CIRCUIT INCLUDING THE SAME AND METHODS OF MANUFACTURING THE SAME

PRIORITY STATEMENT

This application claims priority under 35 U.S.C. §119 to Korean Patent Application No. 10-2007-0058009, filed on Jun. 13, 2007, in the Korean Intellectual Property Office (KIPO), the entire contents of which are incorporated herein by reference.

BACKGROUND

1. Field

Example embodiments relate to a field effect transistor, a logic circuit including the same, and methods of manufacturing the same. Other example embodiments relate to a field effect transistor that may operate as a p type or n type transistor according to the location of a gate on a layer having ambipolar characteristics, a logic circuit including the field effect transistor, and methods of manufacturing the same.

2. Description of the Related Art

A field effect transistor and a complimentary metal oxide semiconductor (CMOS) logic circuit formed on a conventional silicon substrate may have a relatively slow operating speed due to the decreased carrier mobility of silicon. An alternative material to silicon with increased carrier mobility has been studied, for example, in conventional impurity doping, the technique of forming an electrode region and a channel region using a conductive material.

A material, e.g., graphene, may be patterned into a monolithic material layer having a source region, a drain region, and a channel region using a lithography technique. However, the monolithic material layer has ambipolar characteristics, and thus, the monolithic material layer may have difficulty used in a field effect transistor and a logic circuit.

SUMMARY

Example embodiments provide a technique for using a material layer having ambipolar characteristics for a field effect transistor and a logic circuit and methods of manufacturing the same. According to example embodiments, a field effect transistor may include an ambipolar layer that includes a source region, a drain region, and a channel region between the source region and the drain region, wherein the source region, the drain region, and the channel region may be formed in a monolithic structure, a gate electrode on the channel region, and an insulating layer separating the gate electrode from the ambipolar layer, wherein the source region and the drain region have a width greater than that of the channel region in a second direction that crosses a first direction in which the source region and the drain region are connected to each other.

According to example embodiments, a method of manufacturing a field effect transistor may include forming an ambipolar layer including a source region, a drain region, and a channel region between the source region and the drain region in a monolithic structure, forming a gate electrode on the channel region, and forming an insulating layer separating the gate electrode from the ambipolar layer, wherein the source region and the drain region have a width greater than that of the channel region in a second direction that crosses a first direction in which the source region and the drain region are connected to each other.

The gate electrode may be formed close to the source region so that the field effect transistor may operate as an n type transistor. The gate electrode may be formed close to the drain region so that the field effect transistor may operate as a p type transistor. The channel region may have a width of about 5 nm to about 100 nm.

The ambipolar layer may be a single layer, and may be formed of a material selected from the group consisting of boron nitride, cadmium telluride, and niobium selenide. The ambipolar layer may be a half layer formed of bismuth strontium calcium copper oxide. The ambipolar layer may include about 1 to about 9 layers of graphene.

The gate electrode may include a first gate electrode and a second gate electrode respectively formed close to the source region and the drain region above the channel region, wherein when a voltage is selectively applied to the first gate electrode or the second gate electrode, the field effect transistor is of an n type or of a p type. The field effect transistor may further include a substrate, wherein the insulating layer may be formed on the substrate and the ambipolar layer may be formed on the insulating layer. The field effect transistor may further include a substrate, wherein the gate electrode may be formed between the substrate and the insulating layer.

According to example embodiments, a logic circuit may include at least one p type transistor and at least one n type transistor, wherein each of the at least one p type transistor and the at least one n type transistor is the field effect transistor according to example embodiments. According to example embodiments, a method of manufacturing a logic circuit may include fabricating at least one p type transistor and at least one n type transistor according to the method of manufacturing the field effect transistor of example embodiments.

BRIEF DESCRIPTION OF THE DRAWINGS

Example embodiments will be more clearly understood from the following detailed description taken in conjunction with the accompanying drawings. FIGS. 1-10B represent non-limiting, example embodiments as described herein.

FIGS. 1 and 2 respectively are a cross-sectional view and a plan view of a field effect transistor including an ambipolar material according to example embodiments;

FIGS. 4 and 5 respectively are a cross-sectional view and a plan view of a field effect transistor including an ambipolar material according to example embodiments;

FIGS. 6 and 7 respectively are a cross-sectional view and a plan view of a field effect transistor including an ambipolar material according to example embodiments;

FIG. 10B is an equivalent circuit of the NOR logic gate of FIG. 10A.

Figure 1:
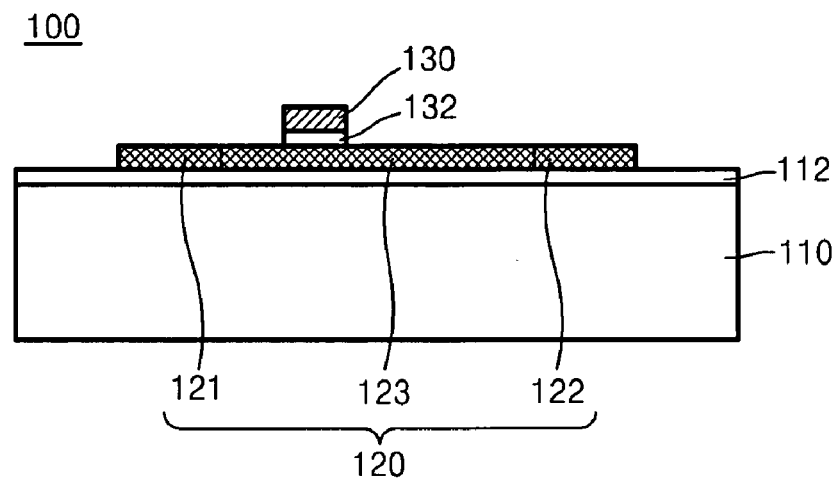

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

A field effect transistor and a logic circuit according to example embodiments will now be described more fully with reference to the accompanying drawings in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to one skilled in the art. In the drawings, the thicknesses of layers and regions are exaggerated for clarity. Like numbers refer to like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
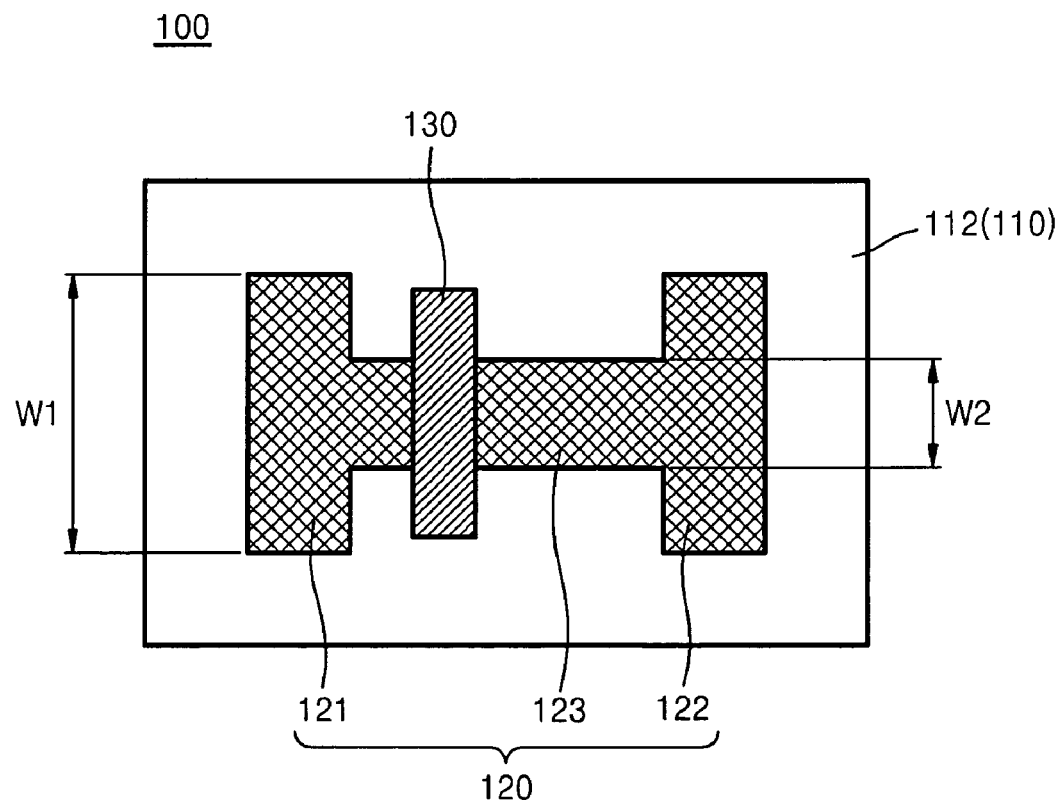

FIGS. 1 and 2 respectively are a cross-sectional view and a plan view of a field effect transistor 100 that includes an ambipolar material according to example embodiments. Referring to FIGS. 1 and 2, the field effect transistor 100 may include an ambipolar layer 120 formed on a substrate 110 and a gate electrode 130 formed on the ambipolar layer 120. The substrate 110 may be an insulating substrate. Also, the substrate 110 may be a conductive substrate, and a first insulating layer 112 may further be formed on the substrate 110.

The ambipolar layer 120 may include a source region 121, a drain region 122, and a channel region 123 formed between the source region 121 and the drain region 122. The source region 121, the drain region 122, and the channel region 123 may be formed in a monolithic structure. The ambipolar layer 120 may be formed of a material having ambipolar characteristics, for example, a single layer formed of graphene, boron nitride, cadmium telluride, niobium selenide, or a half layer formed of bismuth strontium calcium copper oxide. When the ambipolar layer 120 is formed of graphene, the ambipolar layer 120 may include a single graphene layer to about 9 graphene layers.

The source region 121 and the drain region 122 may have a width w1 of about 100 nm to about 200 nm in a second direction that perpendicularly crosses a first direction in which the source region 121 and the drain region 122 are connected to each other, and the channel region 123 may have a width w2 of about 5 nm to about 100 nm in the second direction. The ambipolar layer 120 may have a larger band gap when the width of the ambipolar layer 120 is smaller. A width of the channel region 123 in the first direction may be greater than the width w2 of the channel region 123 in the second direction. For example, the width of the channel region 123 in the first direction may be formed in a range in which the migration of charges has ballistic characteristics.

A second insulating layer 132 may be formed under the gate electrode 130, and the second insulating layer 132 and the gate electrode 130 may be formed of conventional materials in the semiconductor industry. The gate electrode 130 may be formed on a side of the source region 121 above the channel region 123, which makes the field effect transistor 100 operate as an n type transistor.

FIGS. 3A-3D are schematic band gap diagrams showing an operation of the ambipolar field effect transistor 100 according to example embodiments. The ambipolar layer 120 may be formed of graphene. Like reference numerals are used to substantially indicate the same elements as in FIGS. 1 and 2, and thus, the detailed descriptions will not be repeated.

Figure 3A:
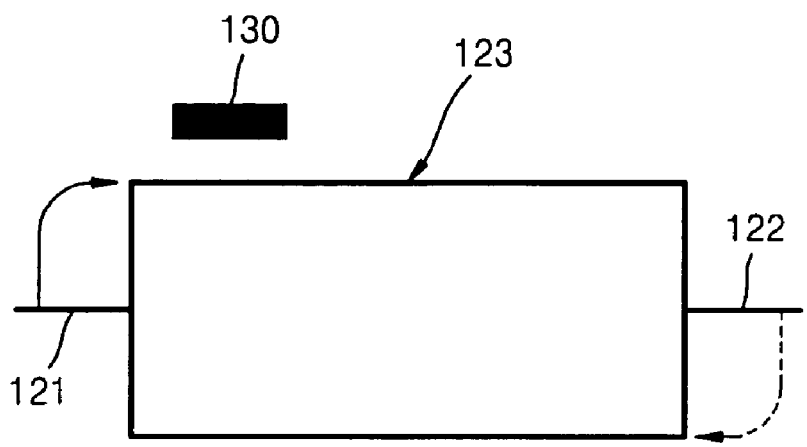
FIGS. 3A-3D are schematic band gap diagrams showing an operation of the ambipolar field effect transistor of FIGS. 1 and 2 according to example embodiments.

Referring to FIG. 3A, a ground voltage may be applied to each of the source region 121, the drain region 122, and the gate electrode 130. A band gap may be relatively low in the source region 121 and the drain region 122 of the ambipolar layer 120, which are relatively wide, and the band gap may be large in the channel region 123 which is relatively narrow. The magnitude of the band gap may vary according to the width of the corresponding region and the ambipolar material.

Figure 3B:
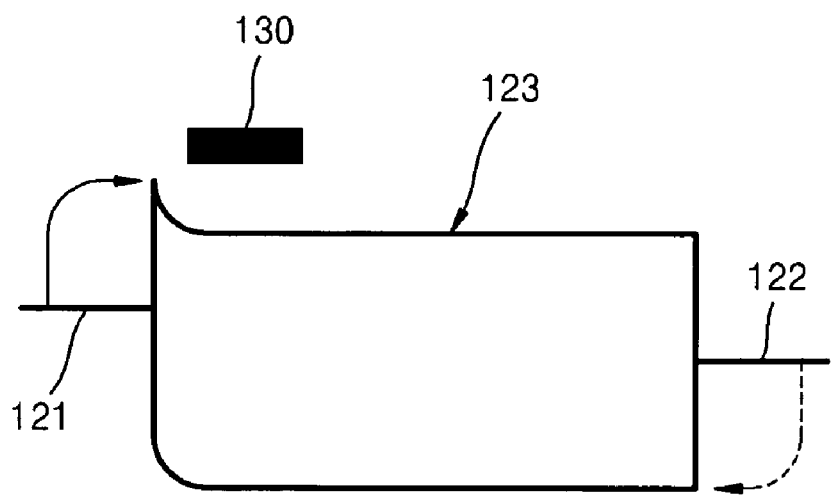

A potential barrier between the source region 121 and the channel region 123 and a potential barrier between the drain region 122 and the channel region 123 respectively may be in a range of about 0.1 eV to about 0.5 eV. The gate electrode 130 may be located close to the source region 121. The ambipolar layer 120 may show a ballistic characteristic in the channel region 123, for example, there may be nearly no potential change in the channel region 123. Referring to FIG. 3B, when a predetermined or given minus voltage is applied to the source region 121, the potential of the source region 121 may increase, and thus, the potential barrier between the source region 121 and the channel region 123 may be reduced.

Figure 3C:
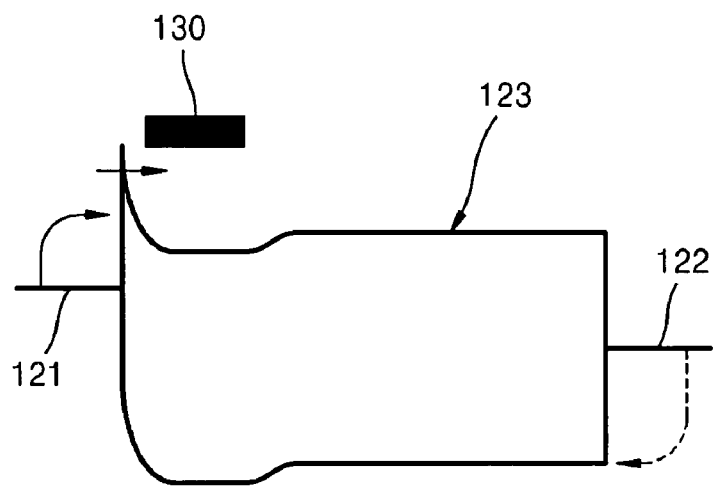
Figure 3D:
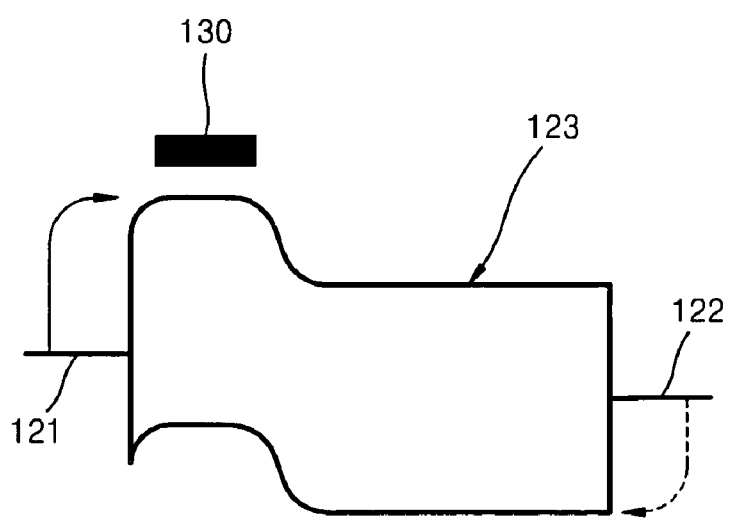

Referring to FIG. 3C, when a positive voltage is applied to the gate electrode 130, band-bending may occur in the channel region 123 and electrons in the source region 121 may move to the channel, for example, when the field effect transistor 100 is turned on. Referring to FIG. 3D, when a minus voltage is applied to the gate electrode 130, band-bending may occur in the channel region 123, and thus, electrons may not move to the channel region 123 from the source region 121 because the potential barrier between source region 121 and the channel region 123 may be higher. In FIGS. 3C and 3D, the height of the potential barrier between the drain region 122 and the channel region 123 may be unchanged, and thus, the movement of holes from the drain region 122 to the channel region 123 may be suppressed. Accordingly, the field effect transistor 100 in FIGS. 1 and 2 may operate as an n type transistor.

Figure 4:
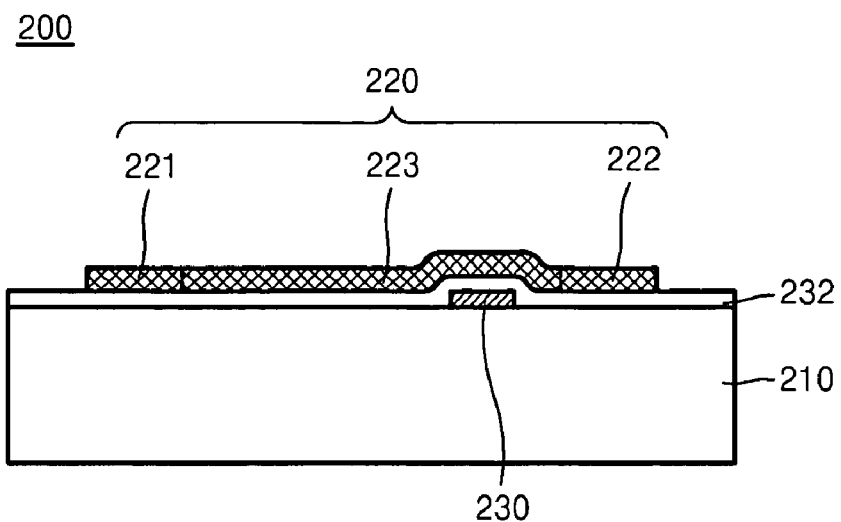
Figure 5:
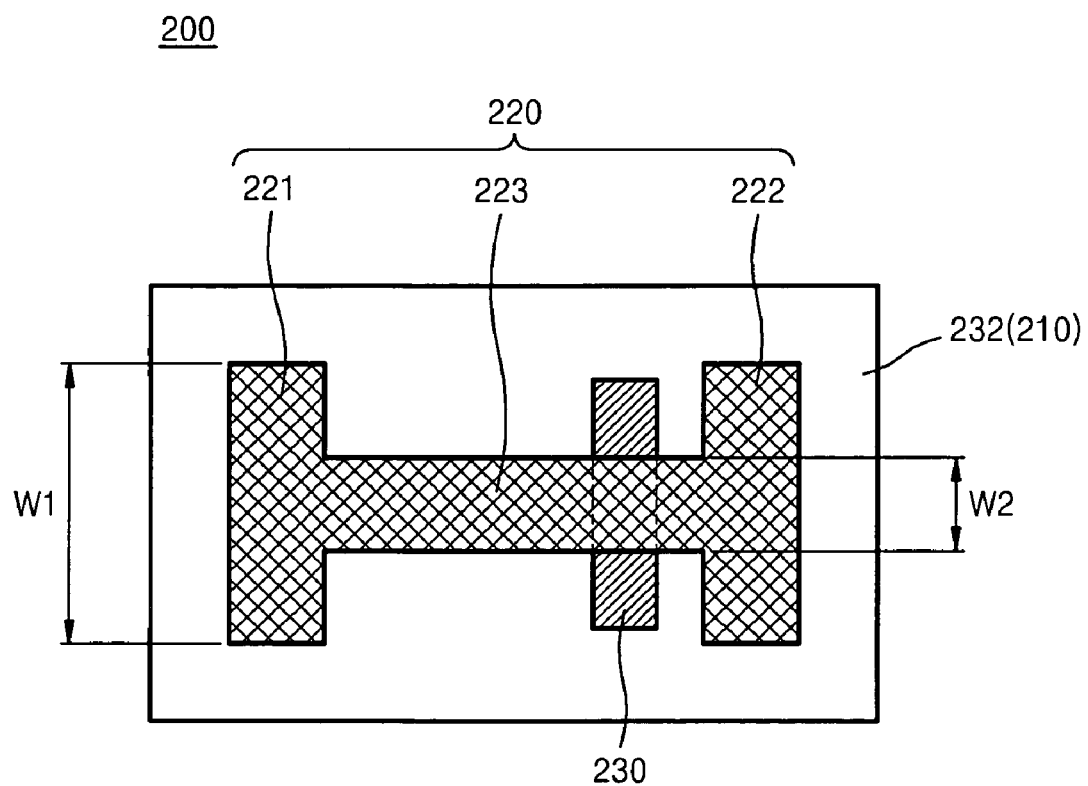

FIGS. 4 and 5 respectively are a cross-sectional view and a plan view of a field effect transistor 200 including an ambipolar material according to example embodiments. Referring to FIGS. 4 and 5, the field effect transistor 200 may include a gate electrode 230 on a substrate 210 and an ambipolar layer 220 formed on the gate electrode 230. The substrate 210 may be an insulating substrate or a conductive substrate. A first insulating layer (not shown) may further be formed between the substrate 210 and the gate electrode 230.

The ambipolar layer 220 may include a source region 221, a drain region 222, and a channel region 223 formed between the source region 221 and the drain region 222. The source region 221, the drain region 222, and the channel region 223 may be formed in a monolithic structure. The ambipolar layer 220 may be a single layer formed of a material having ambipolar characteristics, for example, graphene, boron nitride, cadmium telluride, niobium selenide, or a half layer formed of bismuth strontium calcium copper oxide.

The source region 221 and the drain region 222 may have a width w1 of about 100 nm to about 200 nm in a second direction that perpendicularly crosses a first direction in which the source region 221 and the drain region 222 are connected to each other, and the channel region 223 may have a width w2 of about 5 nm to about 20 nm in the second direction. The ambipolar layer 220 may have a larger band gap when the width thereof is smaller. A width of the channel region 223 in the first direction may be about 1 µm, and may be greater than the width w2 in the second direction. For example, the width of the channel region 123 in the first direction may be formed in a range in which the migration of charges has ballistic characteristics.

A second insulating layer 232 may be formed under the gate electrode 230, and the second insulating layer 232 and the gate electrode 230 may be formed of conventional materials in the semiconductor industry. The gate electrode 230 may be formed on a side of the drain region 222 below the channel region 223. In the field effect transistor 200, when a minus voltage is applied to the gate electrode 230, holes, which are carriers, may move from the drain region 22 to the channel region 223 because a potential barrier between the drain region 222 and the channel region 223 may be reduced, and when a positive voltage is applied to the gate electrode 230, the migration of charges may be stopped because the potential barrier between the drain region 222 and the channel region 223 may be increased. Accordingly, the field effect transistor 200 may operate as a p type transistor.

Figure 6:
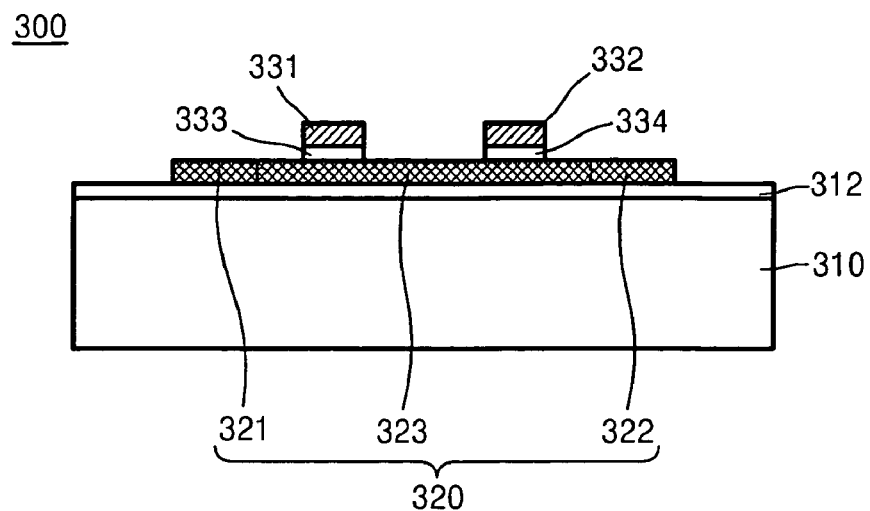
Figure 7:
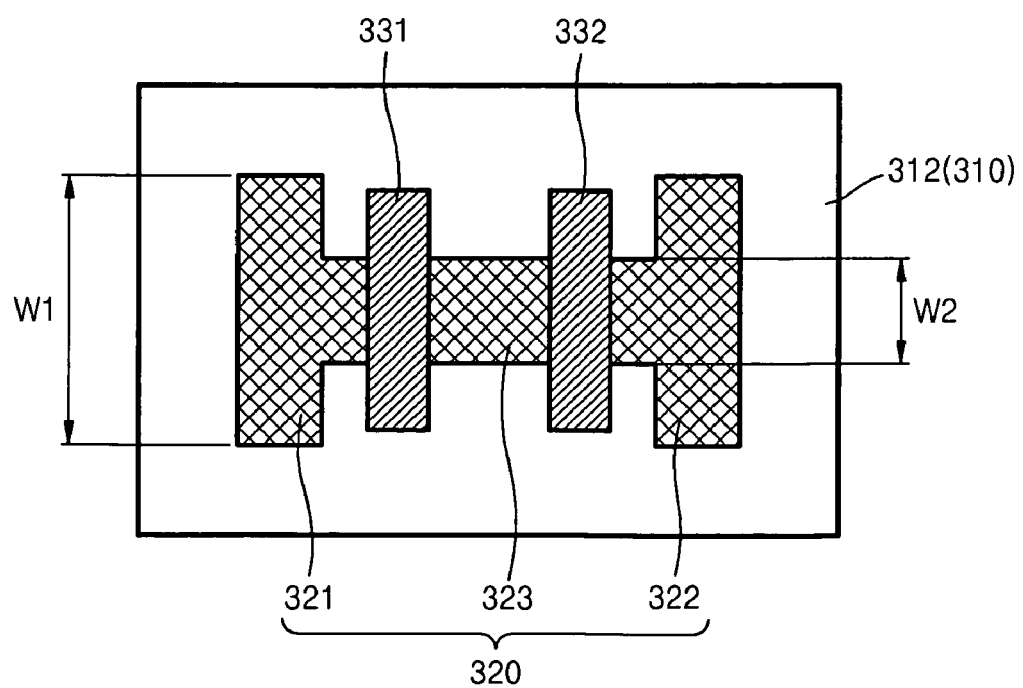

FIGS. 6 and 7 respectively are a cross-sectional view and a plan view of a field effect transistor 300 including an ambipolar material according to example embodiments. Like numerals as in the previous embodiments are used to indicate substantially identical elements, and thus, detailed descriptions will not be repeated. Referring to FIGS. 6 and 7, the field effect transistor 300 may include an ambipolar layer 320 formed on a substrate 310 and a first gate electrode 331 and a second gate electrode 332 formed on the ambipolar layer 320. The substrate 310 may be an insulating substrate or a conductive substrate. A first insulating layer 312 may further be formed on the substrate 310.

The ambipolar layer 320 may include a source region 321, a drain region 322, and a channel region 323 formed between the source region 321 and the drain region 322. The source region 321, the drain region 322, and the channel region 323 may be formed in a monolithic structure. The ambipolar layer 320 may be formed of a material having ambipolar characteristics.

The source region 321 and the drain region 322 may have a width w1 of about 100 nm to about 200 nm in a second direction that perpendicularly crosses a first direction in which the source region 321 and the drain region 322 are connected to each other, and the channel region 323 may have a width w2 of about 5 nm to about 20 nm in the second direction. A second insulating layer 333 may be formed under the first gate electrode 331, a third insulating layer 334 may be formed under the second gate electrode 332, and the second and third insulating layers 333, 334 and the first and second gate electrodes 331, 332 may be formed of conventional materials in the semiconductor industry.

The first gate electrode 331 may be located close to the source region 321 above the channel region 323, and the second gate electrode 332 may be located close to the drain region 322 above the channel region 323. When a voltage is applied to the first gate electrode 331, the field effect transistor 300 may operate as an n type transistor, similar to the field effect transistor 100 of FIGS. 1 and 2, and when a voltage is applied to the second gate electrode 332, the field effect transistor 300 may operate as a p type transistor, similar to the field effect transistor 200 of FIGS. 4 and 5. In the field effect transistor according to example embodiments, a logic gate may be readily formed by patterning a gate electrode after patterning an ambipolar material on a substrate.

Figure 8A:
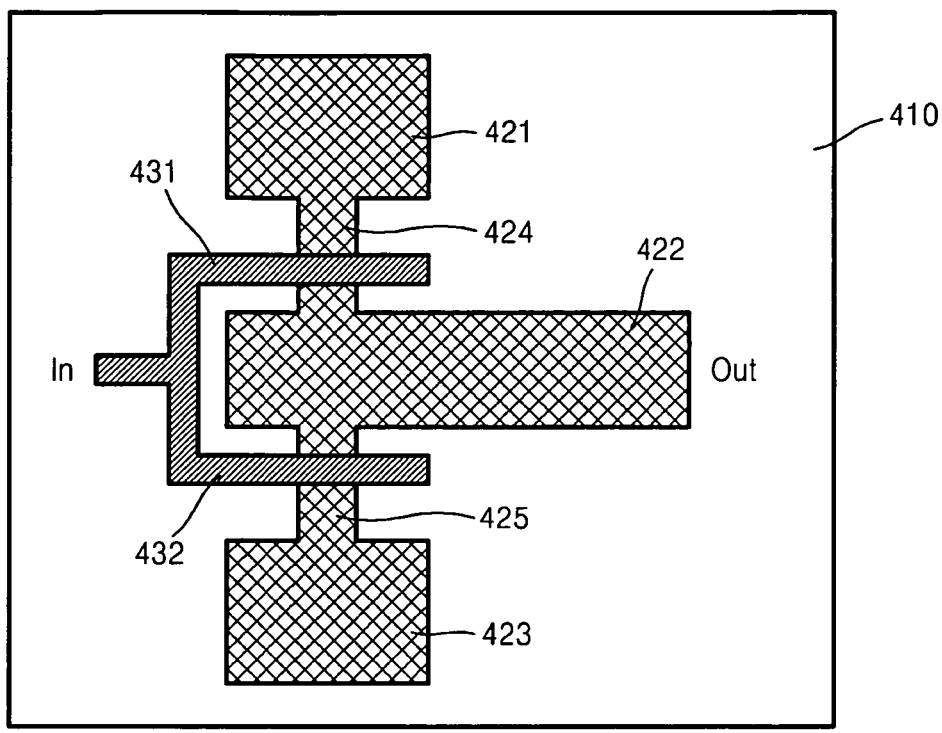
FIG. 8A is a plan view of a NOT logic gate according to example embodiments.
Figure 8B:
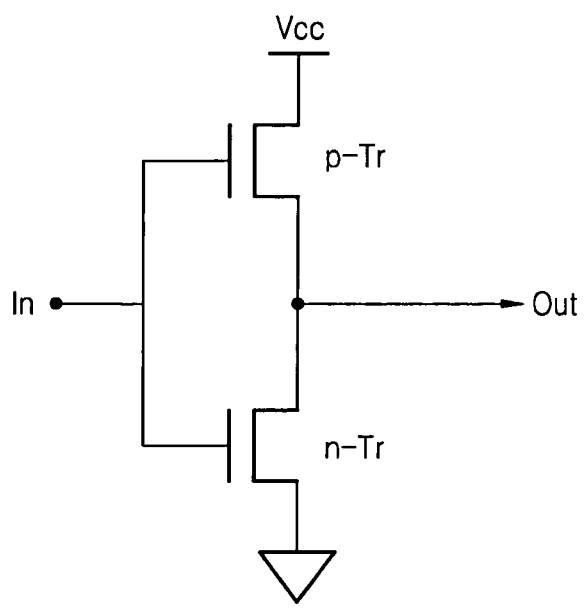
FIG. 8B is an equivalent circuit of the NOT logic gate of FIG. 8A.

FIG. 8A is a plan view of a NOT logic gate 400 according to example embodiments, and FIG. 8B is an equivalent circuit of the NOT logic gate of FIG. 8A. For convenience of explanation, an insulating layer is not shown in FIG. 8A. Referring to FIG. 8A, a source region 421, a common region 422, a drain region 423, a first channel region 424 between the source region 421 and the common region 422, and a second channel region 425 between the common region 422 and the drain region 423, may be formed in a monolithic structure on an insulating substrate 410. A first gate electrode 431 and a second gate electrode 432, respectively, may be formed in the first channel region 424 and the second channel region 425 close to the common region 422. Accordingly, a first transistor formed in the first channel region 424 may be a p type transistor (a p-Tr in FIG. 8B), and a second transistor formed in the second channel region 425 may be an n type transistor (an n-Tr in FIG. 8B). The gate structure of FIG. 8A is the same as the NOT logic gate of FIG. 8B.

Figure 9A:
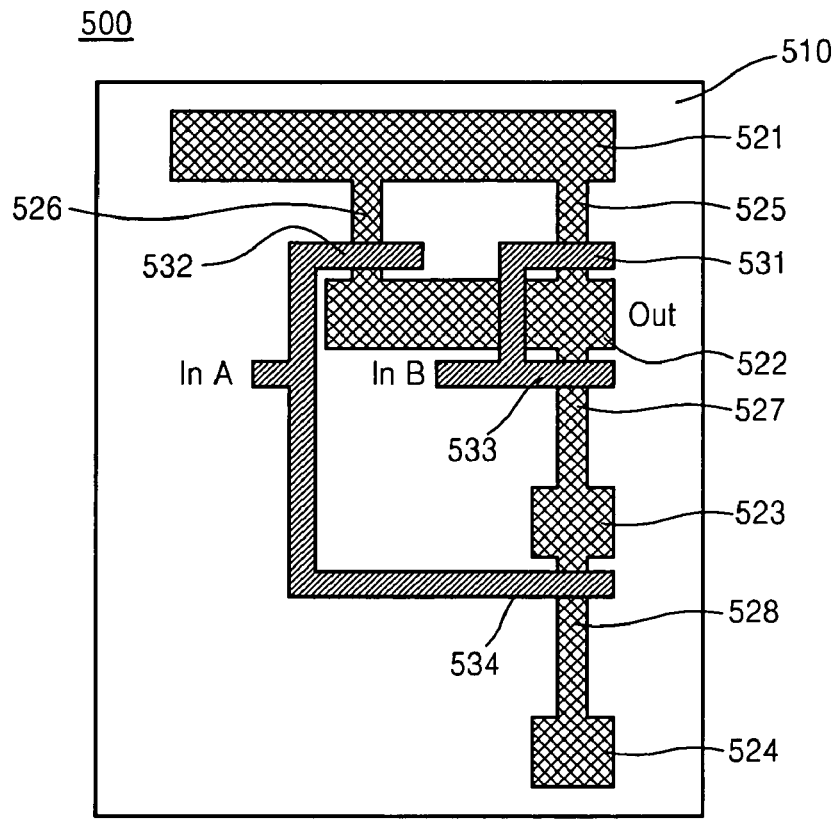
FIG. 9A is a plan view of a NAND logic gate according to example embodiments.
Figure 9B:
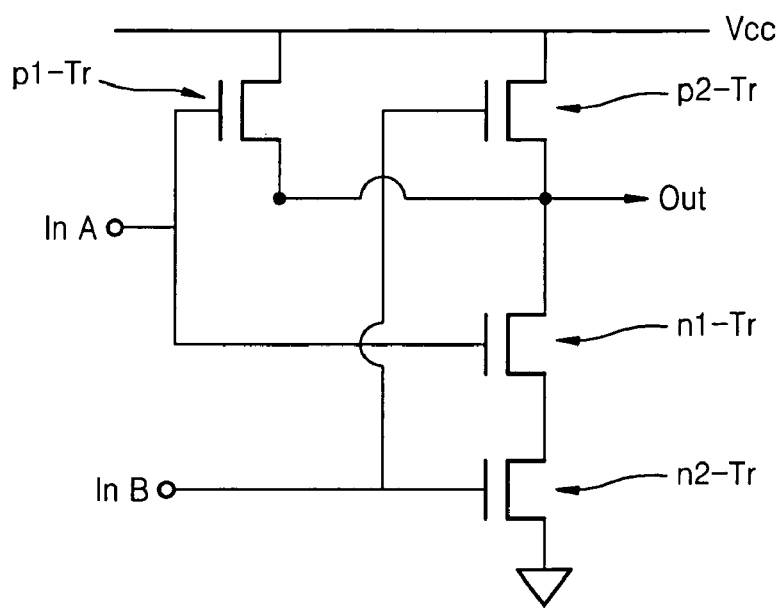
FIG. 9B is an equivalent circuit of the 'NAND' logic gate of FIG. 9A.

FIG. 9A is a plan view of a NAND logic gate 500 according to example embodiments, and FIG. 9B is an equivalent circuit of the NAND logic gate of FIG. 9A. For convenience of explanation, an insulating layer is not included in FIG. 9A. Referring to FIG. 9A, a common source region 521, a first common region 522, a second common region 523, a drain region 524, and first through fourth channel regions 525 through 528 may be formed on an insulating substrate 510. A first gate electrode 531 and a second gate electrode 532, respectively, may be formed in the first channel region 525 and the second channel region 526 close to the first common region 522. A third gate electrode 533 and a fourth gate electrode 534, respectively, may be formed in the third channel region 527 close to the first common region 522 and the fourth channel region 528 close to the second common region 523. Accordingly, a first transistor and a second transistor formed in the first channel region 525 the second channel region 526 are p type transistors (a p1-Tr and a p2-Tr in FIG. 9B). A third and fourth transistors formed in the third and fourth channel regions 527 and 528 are n type transistors (an n1-Tr and an n2-Tr in FIG. 9B). The gate structure in FIG. 9A is the same as the NAND logic gate of FIG. 9B.

Figure 10A:
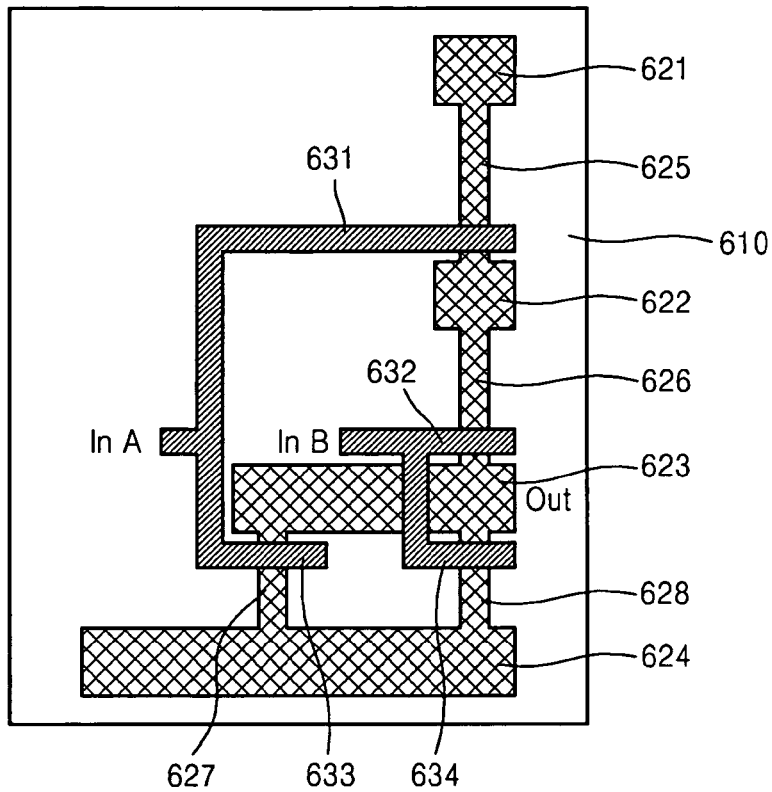
FIG. 10A is a plan view of a NOR logic gate according to example embodiments.
Figure 10B:
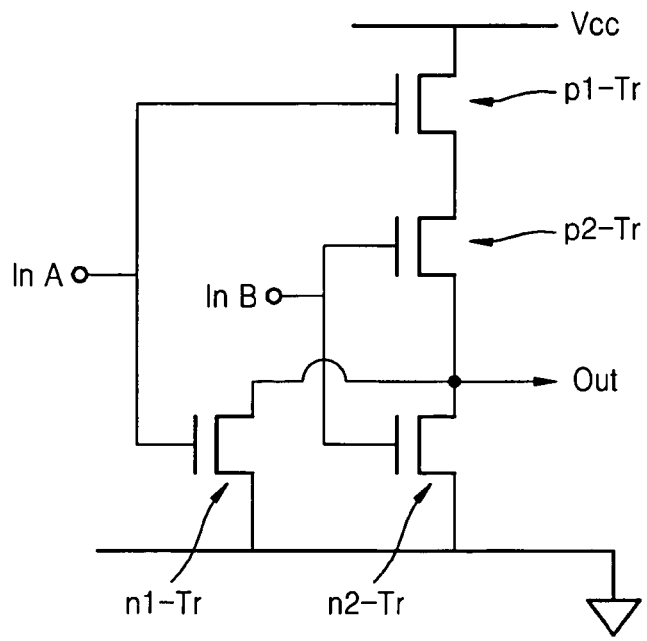

FIG. 10A is a plan view of a NOR logic gate 600 according to example embodiments, and FIG. 10B is an equivalent circuit of the NOR logic gate of FIG. 10A. Referring to FIG. 10A, a source region 621, a first common region 622, a second common region 623, a common drain region 624, and first through fourth channel regions 625 through 628 may be formed on an insulating substrate 610. A first gate electrode 631 and a second gate electrode 632, respectively, may be formed in the first channel region 625 and the second channel region 626 close to the first common region 622 and the second common region 623. A third gate electrode 633 and a fourth gate electrode 634, respectively, may be formed in the third channel region 627 and the fourth channel region 628 close to the second common region 623. Accordingly, a first transistor and a second transistor formed in the first channel region 625 and the second channel region 626, respectively, may be p type transistors (a p1-Tr and a p2-Tr in FIG. 10B). A third and fourth transistors formed in the third and fourth channel regions 627 and 628, respectively, may be formed close to the second common region 623 opposite side of the common drain region 624, and may be n type transistors (an n1-Tr and an n2-Tr in FIG. 10B). The gate structure in FIG. 10A is the same as the NOR logic gate of FIG. 10B.

According to example embodiments, a field effect transistor having n type or p type unipolar characteristics may be realized by forming a gate electrode on a channel region having ambipolar characteristics close to a source region or a drain region. In the field effect transistor of example embodiments, the source region, the drain region, and the channel region may be readily formed by patterning a single material layer having ambipolar characteristics on a substrate. Also, a logic circuit having at least one p type transistor and an n type transistor may be formed using a patterning process.

While example embodiments have been particularly shown and described with reference to example embodiments thereof, it will be understood by those of ordinary skill in the art that various changes in form and details may be made therein without departing from the spirit and scope of the following claims.

What is claimed is:

1. A field effect transistor comprising:
an ambipolar layer including a source region, a drain region, and a channel region between the source region and the drain region, wherein the source region, the drain region, and the channel region are formed in a monolithic structure;
a gate electrode on the channel region; and
an insulating layer separating the gate electrode from the ambipolar layer,
wherein the source region and the drain region have a width greater than that of the channel region in a second direction that crosses a first direction in which the source region and the drain region are connected to each other, and
wherein the gate electrode is a single gate electrode formed closer to the source region than the drain region so that the field effect transistor is of an n type.

2. The field effect transistor of claim 1, wherein the channel region has a width of about 5 nm to about 100 nm.

3. The field effect transistor of claim 1, wherein the ambipolar layer is a single layer.

4. The field effect transistor of claim 1, wherein the ambipolar layer is formed of a material selected from the group consisting of boron nitride, cadmium telluride, and niobium selenide.

5. The field effect transistor of claim 1, wherein the ambipolar layer includes about 1 to about 9 layers of graphene.

6. The field effect transistor of claim 1, further comprising:
a substrate, wherein the insulating layer is formed on the substrate and the ambipolar layer is formed on the insulating layer.

7. The field effect transistor of claim 1, further comprising:
a substrate, wherein the gate electrode is formed between the substrate and the insulating layer.

8. The field effect transistor of claim 1, wherein the second direction perpendicularly crosses the first direction.

9. A logic circuit comprising at least one p type transistor and at least one n type transistor, wherein the at least one n type transistor is the field effect transistor according to claim 1.

10. A field effect transistor comprising:
an ambipolar layer including a source region, a drain region, and a channel region between the source region and the drain region, wherein the source region, the drain region, and the channel region are formed in a monolithic structure;

a gate electrode on the channel region; and an insulating layer separating the gate electrode from the ambipolar layer, wherein the source region and the drain region have a width greater than that of the channel region in a second direction that crosses a first direction in which the source region and the drain region are connected to each other, and wherein the gate electrode is a single gate electrode formed closer to the drain region than the source region so that the field effect transistor is of a p type.

11. The field effect transistor of claim 10, wherein the channel region has a width of about 5 nm to about 100 nm.

12. The field effect transistor of claim 10, wherein the ambipolar layer is a single layer.

13. The field effect transistor of claim 10, wherein the ambipolar layer is formed of a material selected from, the group consisting of boron nitride, cadmium telluride, and niobium selenide.

14. The field effect transistor of claim 10, wherein the ambipolar layer includes about 1 to about 9 layers of graphene.

15. The field effect transistor of claim 10, further comprising:

a substrate, wherein the insulating layer is formed on the substrate and the ambipolar layer is formed on the insulating layer.

16. The field effect transistor of claim 10, further comprising:

a substrate, wherein the gate electrode is formed between the substrate and the insulating layer.

17. The field effect transistor of claim 10, wherein the second direction perpendicularly crosses the first direction.

18. A logic circuit comprising at least one p type transistor and at least one n type transistor, wherein the at least one n type transistor is the field effect transistor according to claim 10.

19. A field effect transistor comprising:

an ambipolar layer including a source region, a drain region, and a channel region between the source region and the drain region, wherein the source region, the drain region, and the channel region are formed in a monolithic structure:

a gate electrode on the channel region; and an insulating layer separating the gate electrode from the ambipolar layer, wherein the source region and the drain region have a width greater than that of the channel region in a second direction that crosses a first direction in which the source region and the drain region are connected to each other, wherein the gate electrode includes first and second gate electrodes formed above the channel region, the first gate electrode formed closer to the source region than the drain region and the second gate electrode formed closer to the drain region than the source region, and wherein when a voltage is selectively applied to the first gate electrode or the second gate electrode, the field effect transistor is of an n type or of a p type, respectively.

* * * * *